US008008990B2

(12) United States Patent
Hidalgo Carpintero et al.

(10) Patent No.: US 8,008,990 B2
(45) Date of Patent: Aug. 30, 2011

(54) GENERALIZED MULTIPLEXING NETWORK

(75) Inventors: Isidro Hidalgo Carpintero, Madrid (ES); Manuel Jesus Padilla Cruz, Madrid (ES); Alejandro Garcia Lamperez, Madrid (ES); Magdalena Salazar Palma, Madrid (ES)

(73) Assignee: Thales, Neuilly sur Seine (FR)

( * ) Notice: Subject to any disclaimer, the term of this patent is extended or adjusted under 35 U.S.C. 154(b) by 971 days.

(21) Appl. No.: 11/283,773

(22) Filed: Nov. 22, 2005

(65) Prior Publication Data

US 2006/0114082 A1 Jun. 1, 2006

(30) Foreign Application Priority Data

Nov. 26, 2004 (EP) .................................... 04292797

(51) Int. Cl.
*H01P 5/12* (2006.01)
*H03H 7/46* (2006.01)

(52) U.S. Cl. ......................... 333/134; 333/126; 333/129

(58) Field of Classification Search .......... 333/126–129, 333/132, 134
See application file for complete search history.

(56) References Cited

U.S. PATENT DOCUMENTS

| | | | | |
|---|---|---|---|---|
| 4,091,344 | A * | 5/1978 | LaTourrette | 333/134 |
| 4,216,448 | A | 8/1980 | Kasuga | |
| 6,025,764 | A * | 2/2000 | Pelz et al. | 333/202 |
| 2003/0011444 | A1 | 1/2003 | Wang | |
| 2003/0184365 | A1 | 10/2003 | Lancaster | |
| 2004/0222868 | A1 * | 11/2004 | Rathgeber et al. | 333/134 |

FOREIGN PATENT DOCUMENTS

EP 0 785 594 A1 7/1997

* cited by examiner

*Primary Examiner* — Robert Pascal
*Assistant Examiner* — Kimberly E Glenn
(74) *Attorney, Agent, or Firm* — Sughrue Mion, PLLC

(57) ABSTRACT

The invention relates generally to RF and microwave multiplexers implemented with a plurality of coupled resonators. More specifically, the present invention relates to multiplexers configured to require only a plurality of resonators and series, shunt, cross couplings and input/output couplings between them. It is a main feature of the invention that no microwave dividers, combiners, circulators, or other junctions are necessary for the distribution of microwave energy among the coupled resonators. This is achieved for example by a P-channel multiplexer comprising P rows of coupled resonators, a common input terminal connected to the first resonator of at least one of said rows, and P channel output terminals connected with the last resonator in each row, and at least one coupling between resonators belonging to different rows.

4 Claims, 14 Drawing Sheets

| Parameter | | Unit | Specifications |
|---|---|---|---|
| Center frequency of channels | 1 | MHz | 12290.00 |
| | 2 | | 12330.00 |
| | 3 | | 12370.00 |
| Channel bandwidth | | MHz | 36.00 |
| Insertion loss at $f_c$ (max.) | | dB | 1.30 |
| Insertion loss flatness (max.) | $f_c$ ± 8 MHz | dBpp | 0.20 |
| | $f_c$ ± 12 MHz | | 0.33 |
| | $f_c$ ± 14 MHz | | 0.50 |
| | $f_c$ ± 16 MHz | | 1.00 |
| | $f_c$ ± 18 MHz | | 3.20 |
| Rejection (min.) | fc ± 24 MHz | dB | 10.00 |
| | fc ± 40 MHz | | 22.00 |
| | fc ± 50 MHz | | 25.00 |
| Group delay (max.) | $f_c$ ± 8 MHz | ns | 4.40 |
| | $f_c$ ± 12 MHz | | 11.00 |
| | $f_c$ ± 14 MHz | | 18.00 |
| | $f_c$ ± 16 MHz | | 32.00 |
| | $f_c$ ± 18 MHz | | 55.00 |
| Input/output return loss (min.) | $f_c$ ± 16 MHz | dB | 20.00 |
| | $f_c$ ± 18 MHz | | 15.00 |

FIG. 5 Typical performance specifications

| | 1 | 2 | 3 | 4 | 5 | 6 | 7 | 8 | 9 | 10 | 11 | 12 |
|---|---|---|---|---|---|---|---|---|---|---|---|---|
| **P1** | 0 | 0 | 0 | 0.9141 | 0 | 0 | 0 | 0 | 0 | 0 | 0 | 0 |
| **P2** | 0 | 0 | 0 | 0 | 0 | 0 | 0 | 1.0010 | 0 | 0 | 0 | 0 |
| **P3** | 0 | 0 | 0 | 0 | 0 | 0 | 0 | 0 | 0 | 0 | 0 | 0.9100 |
| **P4** | 0 | 0 | 0 | 0 | 1.7000 | 0 | 0 | 0 | 0 | 0 | 0 | 0 |
| **1** | 1.7819 | 0.6468 | 0 | 0 | 1.4623 | 0 | 0 | 0 | 0 | 0 | 0 | 0 |
| **2** | 0.6468 | 2.0692 | 0.5875 | 0 | 0 | 0.2882 | 0 | 0 | 0 | 0 | 0 | 0 |
| **3** | 0 | 0.5875 | 2.0821 | 0.7548 | 0 | 0 | -0.0221 | 0 | 0 | 0 | 0 | 0 |
| **4** | 0 | 0 | 0.7548 | 2.0869 | 0 | 0 | 0 | 0.0068 | 0 | 0 | 0 | 0 |
| **5** | 1.4623 | 0 | 0 | 0 | 0 | 1.2434 | 0 | 0 | 1.4623 | 0 | 0 | 0 |
| **6** | 0 | 0.2882 | 0 | 0 | 1.2434 | 0 | 0.6279 | 0 | 0 | 0.2882 | 0 | 0 |
| **7** | 0 | 0 | -0.0221 | 0 | 0 | 0.6279 | 0 | 0.8295 | 0 | 0 | -0.0221 | 0 |
| **8** | 0 | 0 | 0 | 0.0068 | 0 | 0 | 0.8295 | 0 | 0 | 0 | 0 | 0.0068 |
| **9** | 0 | 0 | 0 | 0 | 1.4623 | 0 | 0 | 0 | -1.7819 | 0.6468 | 0 | 0 |
| **10** | 0 | 0 | 0 | 0 | 0 | 0.2882 | 0 | 0 | 0.6468 | -2.0692 | 0.5875 | 0 |
| **11** | 0 | 0 | 0 | 0 | 0 | 0 | -0.0221 | 0 | 0 | 0.5875 | -2.0821 | 0.7548 |
| **12** | 0 | 0 | 0 | 0 | 0 | 0 | 0 | 0.0068 | 0 | 0 | 0.7548 | -2.0869 |

FIG. 8

| | 1 | 2 | 3 | 4 | 5 | 6 | 7 | 8 | 9 | 10 | 11 | 12 |
|---|---|---|---|---|---|---|---|---|---|---|---|---|
| **P1** | 0 | 0 | 0 | $4{,}938 \cdot 10^{-2}$ | 0 | 0 | 0 | 0 | 0 | 0 | 0 | 0 |
| **P2** | 0 | 0 | 0 | 0 | 0 | 0 | 0 | $5{,}626 \cdot 10^{-2}$ | 0 | 0 | 0 | 0 |
| **P3** | 0 | 0 | 0 | 0 | 0 | 0 | 0 | 0 | 0 | 0 | 0 | $4{,}938 \cdot 10^{-2}$ |
| **P4** | 0 | 0 | 0 | 0 | $9{,}322 \cdot 10^{-2}$ | 0 | 0 | 0 | 0 | 0 | 0 | 0 |
| **1** | - | $1{,}963 \cdot 10^{-3}$ | 0 | 0 | $4{,}459 \cdot 10^{-3}$ | 0 | 0 | 0 | 0 | 0 | 0 | 0 |
| **2** | $1{,}963 \cdot 10^{-3}$ | - | $1{,}792 \cdot 10^{-3}$ | 0 | 0 | $9{,}299 \cdot 10^{-4}$ | 0 | 0 | 0 | 0 | 0 | 0 |
| **3** | 0 | $1{,}792 \cdot 10^{-3}$ | - | $2{,}310 \cdot 10^{-3}$ | 0 | 0 | $-5{,}287 \cdot 10^{-5}$ | 0 | 0 | 0 | 0 | 0 |
| **4** | 0 | 0 | $2{,}310 \cdot 10^{-3}$ | - | 0 | 0 | 0 | $1{,}502 \cdot 10^{-5}$ | 0 | 0 | 0 | 0 |
| **5** | $4{,}459 \cdot 10^{-3}$ | 0 | 0 | 0 | - | $3{,}829 \cdot 10^{-3}$ | 0 | 0 | $4{,}459 \cdot 10^{-3}$ | 0 | 0 | 0 |
| **6** | 0 | $9{,}299 \cdot 10^{-4}$ | 0 | 0 | $3{,}829 \cdot 10^{-3}$ | - | $1{,}960 \cdot 10^{-3}$ | 0 | 0 | $9{,}299 \cdot 10^{-4}$ | 0 | 0 |
| **7** | 0 | 0 | $-5{,}287 \cdot 10^{-5}$ | 0 | 0 | $1{,}960 \cdot 10^{-3}$ | - | $2{,}583 \cdot 10^{-3}$ | 0 | 0 | $-5{,}287 \cdot 10^{-5}$ | 0 |
| **8** | 0 | 0 | 0 | $1{,}502 \cdot 10^{-5}$ | 0 | 0 | $2{,}583 \cdot 10^{-3}$ | - | 0 | 0 | 0 | $1{,}502 \cdot 10^{-5}$ |
| **9** | 0 | 0 | 0 | 0 | $4{,}459 \cdot 10^{-3}$ | 0 | 0 | 0 | - | $1{,}963 \cdot 10^{-3}$ | 0 | 0 |
| **10** | 0 | 0 | 0 | 0 | 0 | $9{,}299 \cdot 10^{-4}$ | 0 | 0 | $1{,}963 \cdot 10^{-3}$ | - | $1{,}792 \cdot 10^{-3}$ | 0 |
| **11** | 0 | 0 | 0 | 0 | 0 | 0 | $-5{,}287 \cdot 10^{-5}$ | 0 | 0 | $1{,}792 \cdot 10^{-3}$ | - | $2{,}310 \cdot 10^{-3}$ |
| **12** | 0 | 0 | 0 | 0 | 0 | 0 | 0 | $1{,}502 \cdot 10^{-5}$ | 0 | 0 | $2{,}310 \cdot 10^{-3}$ | - |

FIG. 9

| Resonator | Frequency (MHz) |
|---|---|
| 1 | 12296.23 |
| 2 | 12290.62 |
| 3 | 12290.47 |
| 4 | 12290.20 |
| 5 | 12330.00 |
| 6 | 12330.00 |
| 7 | 12330.00 |
| 8 | 12330.00 |
| 9 | 12364.02 |
| 10 | 12369.52 |
| 11 | 12369.90 |
| 12 | 12369.85 |

FIG. 10

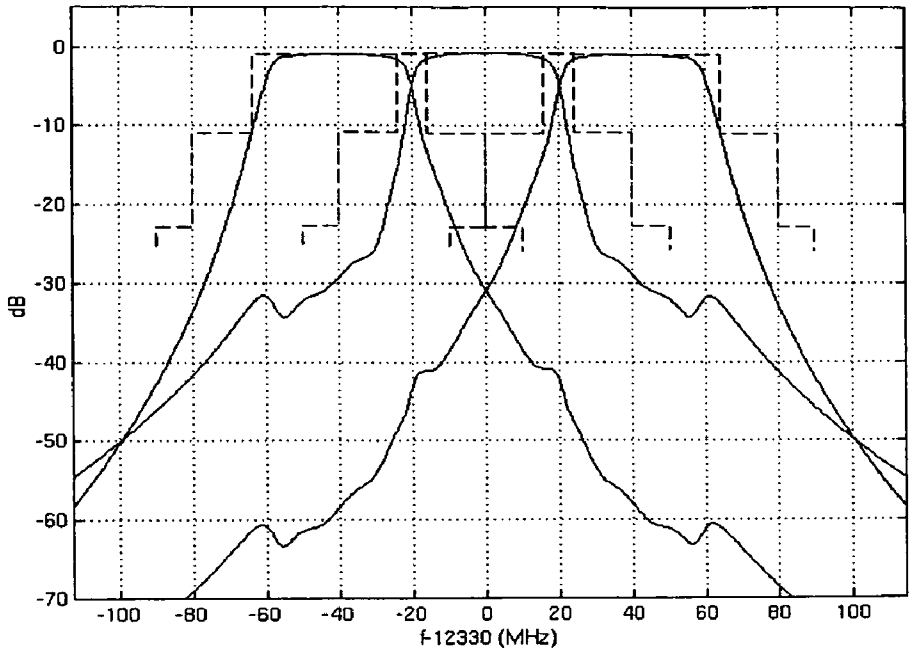
FIG. 11 Selectivity
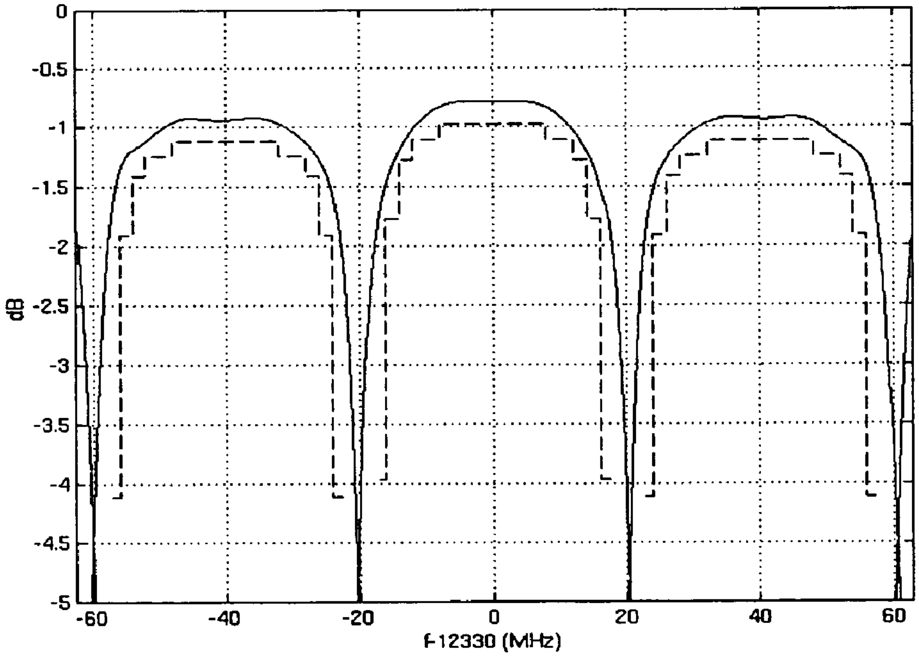
FIG. 12 Insertion Loss Flatness

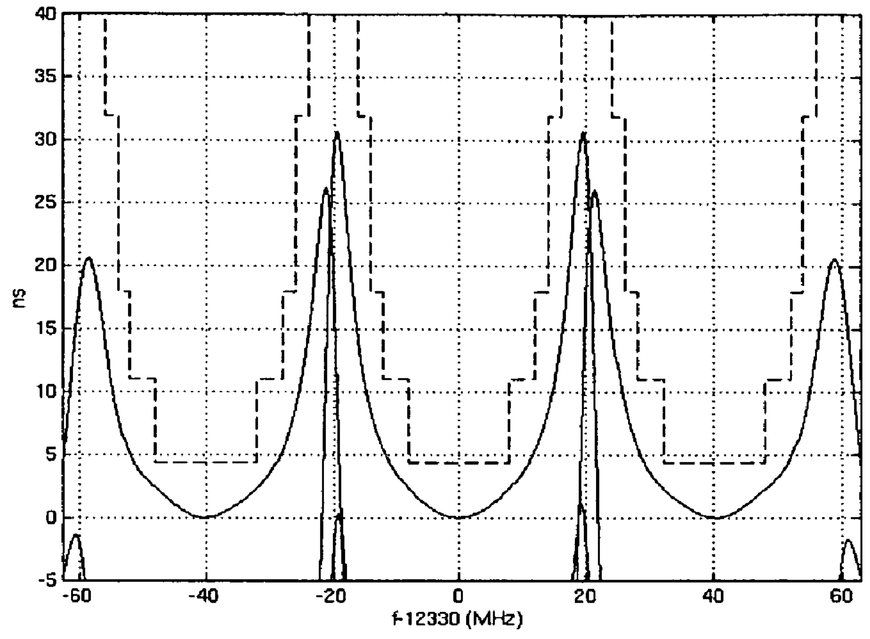
FIG. 13 Channels group delay
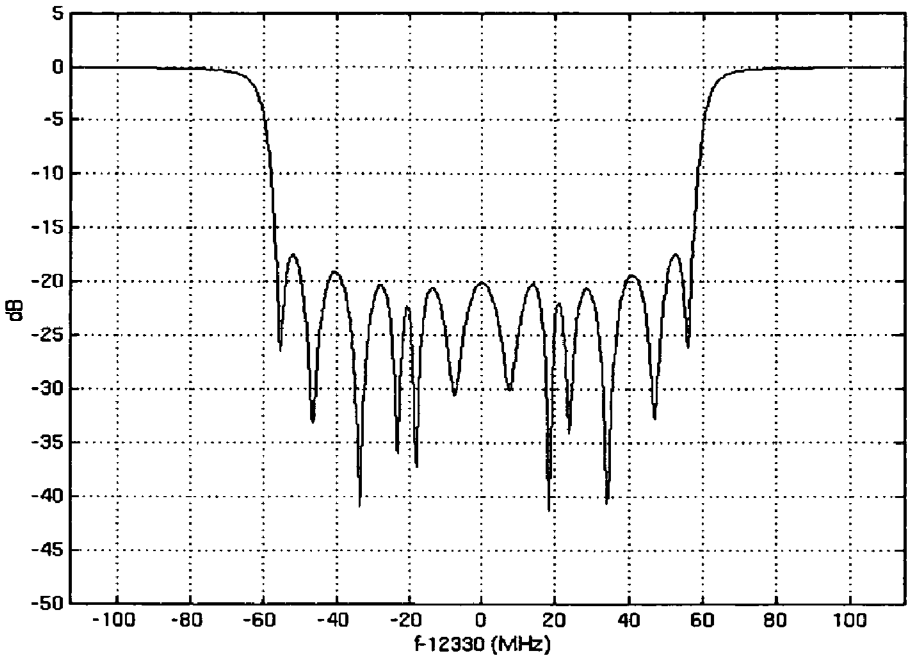
FIG. 14 Common port return loss

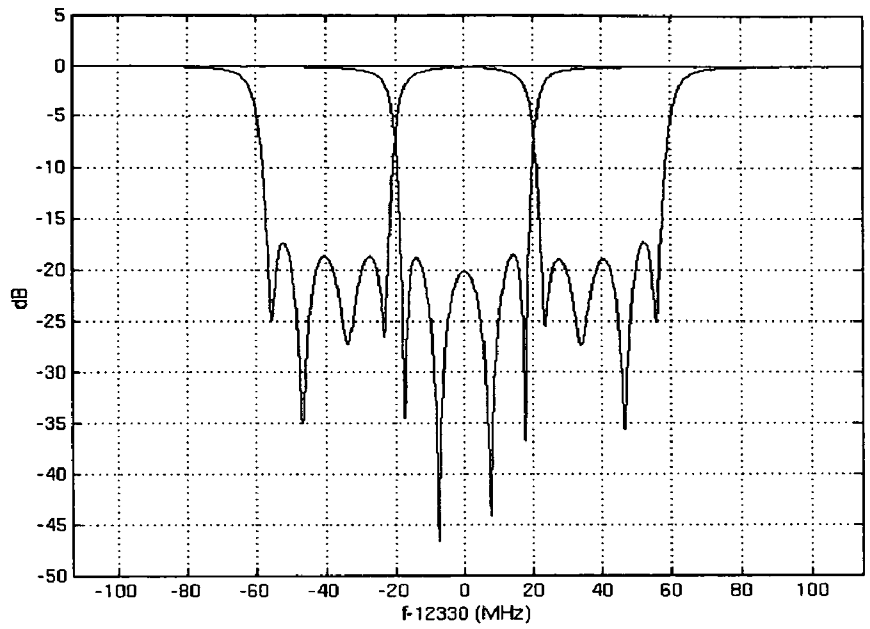
FIG. 15 Channel output port return loss
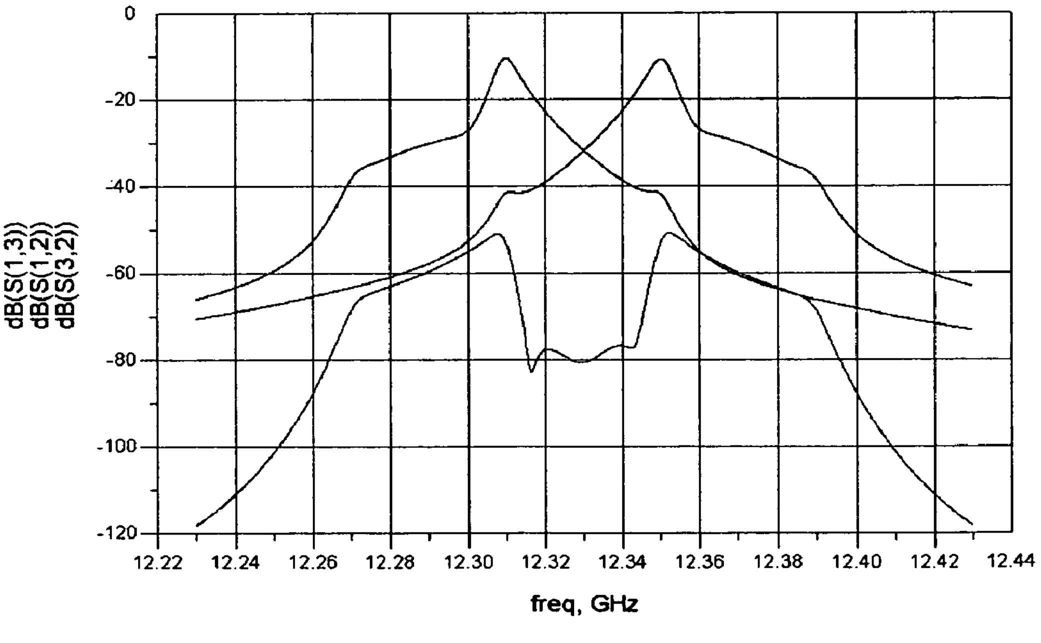
FIG. 16 Isolation between channels

GENERALIZED MULTIPLEXING NETWORK

BACKGROUND OF THE INVENTION

1. Field of the Invention

The invention relates generally to RF and microwave multiplexers implemented with a plurality of coupled resonators. More specifically, the present invention relates to multiplexers configured to require only a plurality of resonators and series, shunt, cross couplings and input/output couplings between them.

2. Description of the Related Art

Frequency domain demultiplexers and multiplexers are generally used in communication systems to selectively separate (respectively combine) specific signals or frequency bandwidths (these signals or frequency bandwidths also known as channels) from (respectively into) a single signal or frequency band. This objective is usually achieved by the use of coupled resonators bandpass filters (which are usually called channel filters), that freely pass frequencies within specified frequency range, while rejecting frequencies outside the specified limits, and a distribution network that divides (respectively combines) the signals or frequencies going into (respectively coming from) the filters.

Main differences among multiplexers arise from the distribution network, also known as multiplexing network, as filters are always of the coupled resonators type. There are a number of known technical solutions to implement such a network, most commonly used, depending on each particular design, are: multiple-way or cascaded dividers, circulators drop-in chains and manifold networks (i.e. filters connected by lengths of transmission lines: waveguide, coaxial, etc. and "T" junctions).

Description of such multiplexers, and corresponding design theory can be found in the literature: "Design of General Manifold Multiplexers" Rhodes, J. D.; Levy, R.; Microwave Theory and Techniques, IEEE Transactions on, Volume: 27, Issue: 2, February 1979 Pages: 111-123, "A Generalized Multiplexer Theory" Rhodes, J. D.; Levy, R.; Microwave Theory and Techniques, IEEE Transactions on, Volume: 27, Issue: 2, February 1979 Pages: 99-111 and "Innovations in microwave filters and multiplexing networks for communications satellite systems" Kudsia, C.; Cameron, R.; Tang, W.-C.; Microwave Theory and Techniques, IEEE Transactions on, Volume: 40, Issue: 6, June 1992, Pages: 1133-1149.

Usual approach to the design of multiplexers is to separately design each channel filter and then to design the corresponding multiplexing network. In the case of manifold multiplexing, most of the time a final optimization of the elements of the complete multiplexer is needed in order to meet the electrical requirements, and this could be computationally costly when a high number of channels must be optimized using electromagnetic simulations.

FIG. 1 shows a prior art nth order coupled resonator filter used as a building block to implement the above described multiplexers. Each of the boxes represents a resonator (without loss of generality it could be a lumped elements RLC resonator, dielectric resonator, cavity resonator, or any other type of resonator known in the art) and the lines connecting the resonators represent couplings (without loss of generality it could be a lumped element capacitance or inductance, an iris, intercavity apertures, or any other type of coupling known in the art). The filter of FIG. 1 is a canonical one for the nth order, that is, without loss of generality it can implement any nth order transfer function.

FIG. 2 shows a prior art P-channel multiplexer with a 1:P divider multiplexing network.

FIG. 3 shows a prior art P-channel multiplexer with a circulator drop-in chain demultiplexing network.

FIG. 4 shows a prior art P-channel multiplexer with a manifold multiplexing network.

As will be appreciated by those skilled in the art, each of the previously shown configurations present disadvantages: dividers present high insertion losses and/or could have large volume, drop-in chains with circulators are costly and they are not well suited for power applications and finally, manifold networks have large footprints and mass, and they are costly to design and optimize.

SUMMARY OF THE INVENTION

In order to eliminate the previously described multiplexing networks and their accompanying drawbacks, a new topology for multiplexers is used. This topology consists of a number of intercoupled resonators and several input-output ports connected to some of the resonators.

To accomplish these and other improvements, the invention implements a plurality of asynchronously-tuned coupled resonators, one of them coupled to a common port, and a plurality P of them coupled to P input/output channel ports.

According to a first embodiment of the present invention, a 2-channel multiplexer is provided, having a first plurality of n series coupled resonators defining a first row, a second plurality of n series coupled resonator cavities defining a second row, a common port in communication with a preselected resonator of the first row, an output terminal #1 in communication with a preselected output resonator cavity of the first row, an output terminal #2 in communication with a preselected output resonator cavity of the second row, and at least one parallel coupling between said first row and said second row, and at least one parallel coupling between said first row nd said second row. According to a second, more general embodiment of the present invention, a P-channel multiplexer is provided, having P sets of n series coupled resonators defining P rows of n sequentially coupled resonators, a common port in communication with the first resonator of a first preselected row, and P output terminals, each I-th output terminal being connected with the respective last resonator of the I-th row, with I an integer between 1 and P, and at least one coupling between at least one resonator of the j-th row and a resonator of the (j+1)th row, with j an integer between 1 and P.

According to another even more general embodiment of the invention, the number of poles per channel may be different for the different channels, which means that the number of resonant elements per row may be different from row to row, in other words, the n in the above mentioned embodiment may vary and may take on P different values for the respective P channels. This will be described more in detail in relation with the figures.

With the aim to better describe the invention, the design steps of such a device are disclosed hereafter. For that purpose an arbitrary example of typical multiplexer (triplexer) specifications are taken into account (FIG. 5).

The First step is to define complex-rational functions (Chebychev) for each channel lowpass prototype output return loss (in the same way they are defined for two port filters) this defines the initial position of all the poles of the multiplexer, and thus the order (number of resonators) of the multiplexer. The initial common-port return losses are defined as the product of all of these functions:

$$\|\tilde{S}_{pp}(s)\| = \prod_{i=1}^{p-1} \|\tilde{S}_{ii}(s)\|$$

Most of the time an optimisation of the positions of the poles and zeros of the function must be performed in order to comply with return loss specifications at the common port. It also must be noted that both purely imaginary zeroes or zeroes with a real part could be prescribed in each channel's response.

Once the transfer function has been defined by means of complex rational functions a suitable network must be chosen to implement such transfer function. The network is formed of nodes interconnected by electromagnetic couplings. The nodes are of two classes:

Resonant nodes, or simply resonators.

Non resonant loaded nodes, or ports.

This kind of networks can be described using a generalized coupling matrix, formed by blocks. The coefficients of each block correspond to couplings of different kinds:

Couplings between two resonators, or inner couplings. This matrix is square and symmetric. The diagonal contains the self couplings of the resonators, that take into account the frequency shifting with respect to a reference frequency.

Direct couplings between two ports. The network presented in this document has no direct couplings, and this matrix is zero. Therefore, this matrix is not represented.

Couplings between one port and one resonator, or input/output couplings.

It should be noted that this coupling matrix for networks with an arbitrary number of ports is a generalization of the extended coupling matrix for filters described, for example, in "Synthesis of N-even order symmetric filters with N transmission zeros by means of source-load cross coupling", J. R. Montejo-Garai, *Electronic Letters*, vol. 36, no. 3, pp. 232-233, February 2000, or "Advanced coupling matrix synthesis techniques for microwave filters" R. J. Cameron, IEEE Trans. Microwave Theory Tech., vol. 51, no. 1, pp. 1-10, January 2003.

The coupling topology of the multiplexer conceived to fulfil the specifications of FIG. 5 is shown in FIG. 6. The structure of the corresponding coupling matrix is presented in FIG. 7, where the different submatrices are marked. The non-zero values are marked with "X", all other values are zero.

It can be seen that the transfer of power between the common port and the channels 1 and 3 is performed through several couplings between those channels and the central channel (number 2). There is no need of an external power divider or manifold. The interaction between channels introduces several incomplete zeros in the transmission response of each channel. Those zeros are located in the passbands of the opposite channels. The multiple couplings between channels are used to control the location of those incomplete transmission zeros. In this way, the zeros are used to increase the selectivity between channels. It should be noted that complete transmission zeros, or even equalization zeros, can also be inserted at prescribed locations by allowing cross couplings inside each channel. However this is not the case in the design presented here.

The coupling matrix is obtained in this case using an optimization algorithm. This algorithm modifies the values of the coupling coefficients in order to reduce a cost function. Only the non-zero coupling coefficients from FIG. 7 are taken into account; therefore, the coupling topology of the network is always ensured.

The cost function is a quadratic one. It is formed by two components:

1. Error between the reflection coefficient at the common port, and the product of the reflection coefficients of three isolated filters. The order and response of those filters are chosen so that the specifications are fulfilled.
2. Value of the transmission coefficients between the ports 1, 2, and 3, that is, the isolation coefficients between channel ports.

In both cases, only the modulus, not the phase, is used. The use of this cost function forces several characteristics of the network response.

The prescribed location of the reflection zeros.

The prescribed level of return loss at each passband.

Isolation between channel ports as low as possible.

As a consequence of the previous conditions, the transmission of each channel at its passband is maximized, since for a lossless network, the reflected power, the power transmitted from the common port to the channel ports and the power between channel ports is equal to the incident power (power conservation).

It is possible to analytically compute the gradient of a cost function of this type. Therefore, a gradient-based quasi Newton optimization algorithm has been used, in a similar way as is done in "Synthesis of cross-coupled lossy resonator filters with multiple input/output couplings by gradient optimization" A. García Lampérez, M. Salazar Palma, M. J. Padilla Cruz, and I. Hidalgo Carpintero, in *Proceedings of the* 2003 *IEEE Antennas and Propagation Society International Symposium*, Columbus, Ohio, EEUU, June 2003, pp. 52-55, "Synthesis of general topology multiple coupled resonator filters by optimization" W. A. Atia, K. A. Zaki, and A. E. Atia, in 1998 *IEEE MTT-S International Microwave Symposium Digest*, vol. 2, June 1998, pp. 821-824, or "Synthesis of cross-coupled resonator filters using an analytical gradient-based optimization technique", S. Amari, *IEEE Trans. Microwave Theory Tech.*, vol. 48, no. 9, pp. 1559-1564, September 2000.

The band-pass to low-pass transformation uses the following parameters:

Center frequency: $f_0$=12330 MHz

Bandwidth: $\Delta f$=38 MHz (±19 MHz)

The resulting coupling matrix is presented in FIG. 8.

From the previous low-pass coupling matrix, the corresponding band-pass coupling matrix can be computed in the same way as is done for band-pass filters. With reference impedances at the ports and resonators equal to one, the coupling matrix is presented in FIG. 9.

The description of the network is completed by the resonant frequency of each resonator: that is included in FIG. 10.

It can be seen that the resonators of the center channel are synchronously tuned, and the distribution of resonant frequencies of channels 1 and 3 are symmetrical respect to $f_0$.

From the previous data it is evident for anyone skilled in the art to implement the circuit using any type of resonators like waveguide, dielectric resonators, etc. but in order to verify the correctness of the design process a simulation has been performed using lumped elements resonators and couplings, that is the resonators and couplings are implemented by means of capacitors and inductances, though this is not a practical way to implement a network at working frequencies as high as those of the presented design. FIGS. 11-16 present simulations of such an implementation together with specifications masks. In these plots the solid lines are different parameters of the device response and dashed ("straight") lines are specification masks.

BRIEF DESCRIPTION OF THE DRAWINGS

The foregoing and other features, objects, and advantages of the invention will be better understood by reading the following description in conjunction with the drawings, in which:

FIG. 5 shows typical specifications of a multiplexer, in this case a triplexer.

FIG. 8 shows an example of a low-pass coupling matrix.

FIG. 9 shows an example of a band-pass coupling matrix.

FIG. 10 shows an example of a set of resonant frequencies of the resonant elements of the FIG. 6.

FIG. 11 shows the simulation of the selectivity of each channel measured between the common port and the corresponding output port.

FIG. 12 shows the simulation of the insertion loss flatness channel measured between the common port and the corresponding output.

FIG. 13 shows the simulation of the group delay of each channel measured between the common port and the corresponding output port.

FIG. 14 shows the simulation of the return loss at the common port.

FIG. 15 shows the simulation of the return loss at each output port.

FIG. 16 shows the isolation between channels measured between output ports.

DETAILED DESCRIPTION OF THE INVENTION

The various features of the present invention will now be described with respect to the FIG. 6 and following, which represent several exemplary embodiments of the invention and some of their relevant characteristics.

Figure 1:
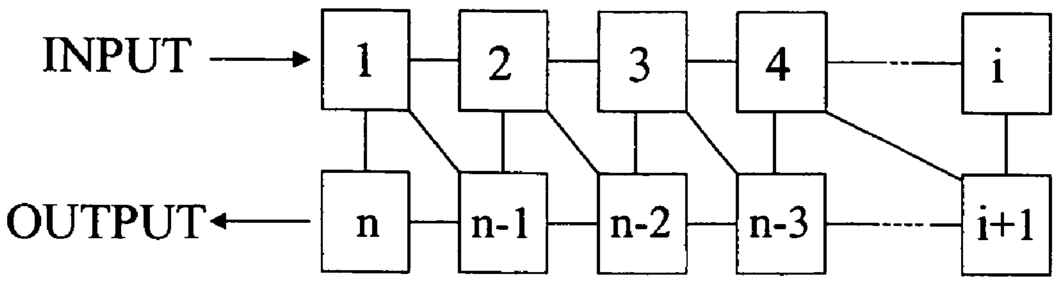
FIG. 1 Prior art
FIG. 1 shows a prior art nth order coupled resonator filter used as a building block to implement the above described multiplexers. Each of the boxes represents a resonator (without loss of generality it could be a lumped elements RLC resonator, dielectric resonator, cavity resonator, or any other type of resonator known in the art) and the lines connecting the resonators represent couplings (without loss of generality it could be a lumped element capacitance or inductance, an iris, intercavity apertures, or any other type of coupling known in the art). The filter of FIG. 1 is a canonical one for the nth order, that is, without loss of generality it can implement any nth order transfer function.
Figure 2:
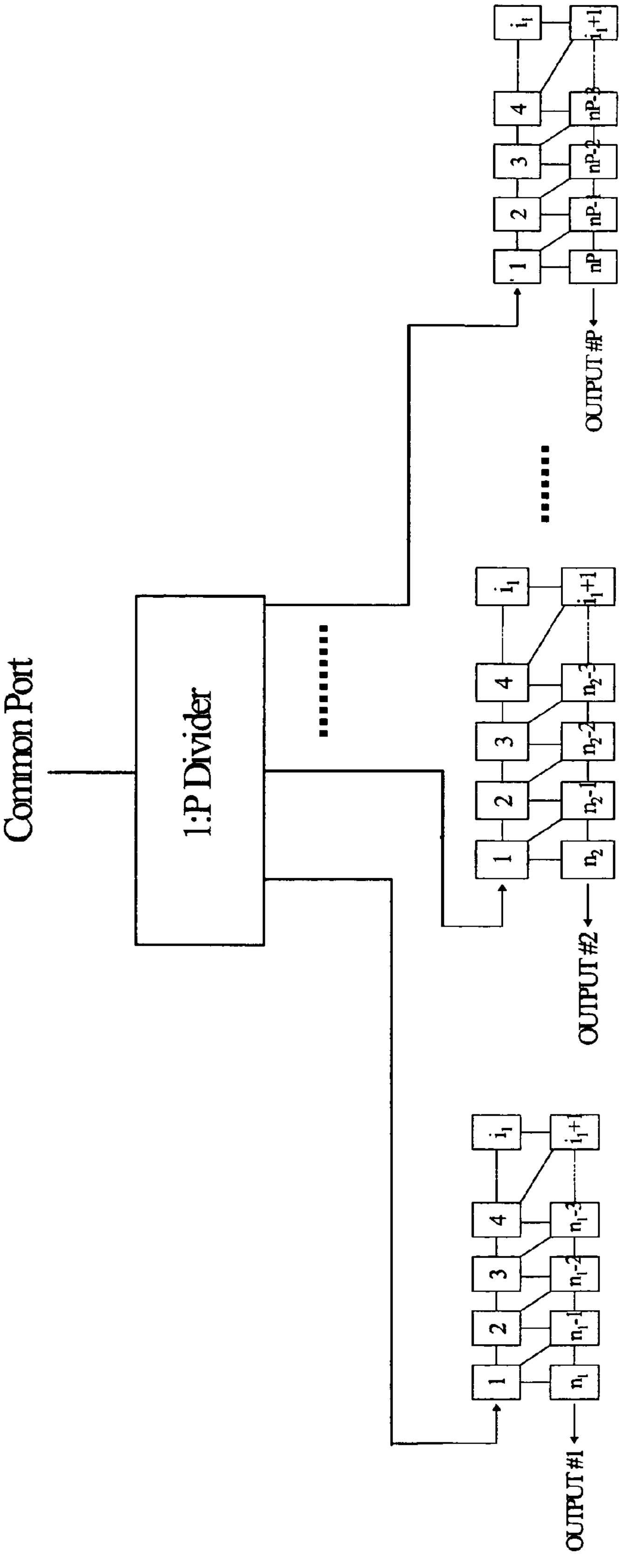
FIG. 2 Prior Art
FIG. 2 shows a P-channel multiplexer with a 1:P divider multiplexing network.
Figure 3:
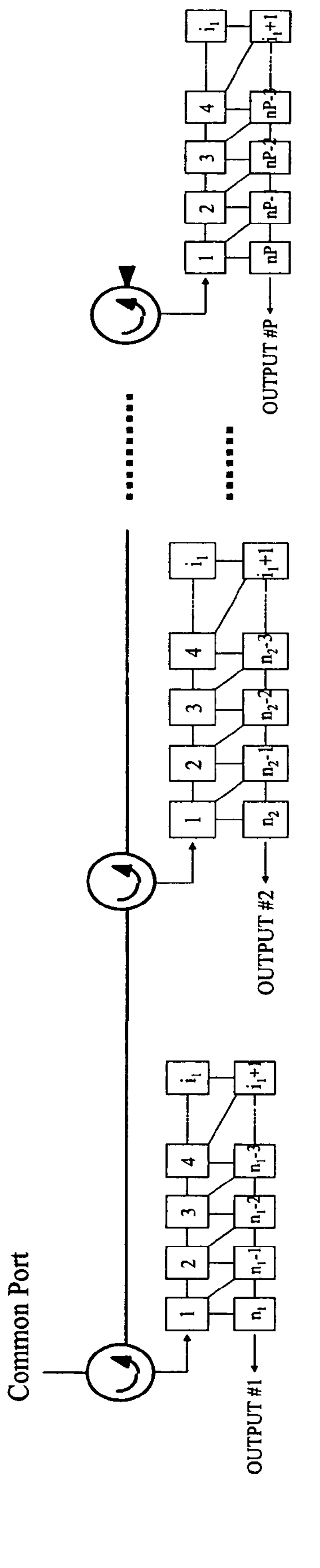
FIG. 3 Prior Art
FIG. 3 shows a P-channel multiplexer with a circulator drop-in chain demultiplexing network.
Figure 4:
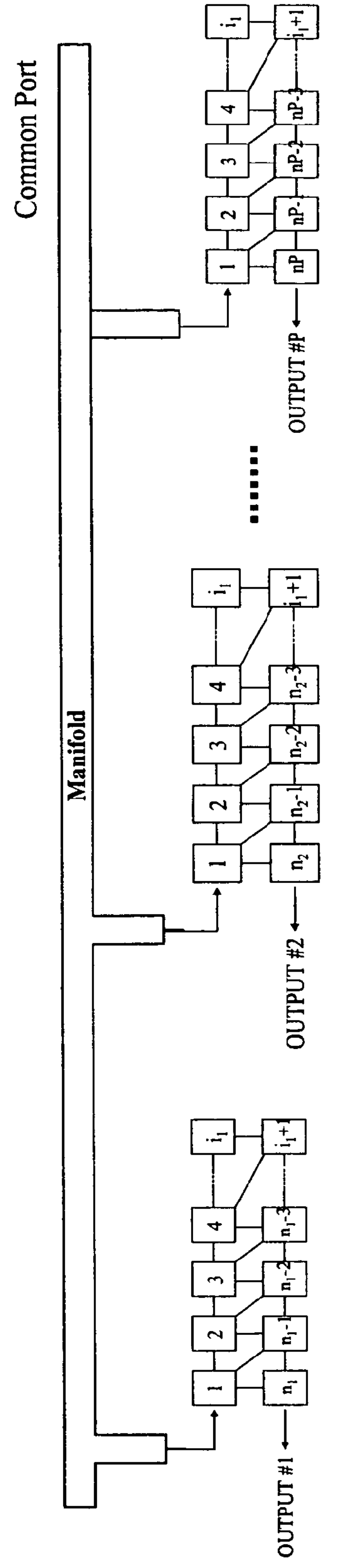
FIG. 4 Prior Art
FIG. 4 shows a P-channel multiplexer with a manifold multiplexing network.
Figure 6:
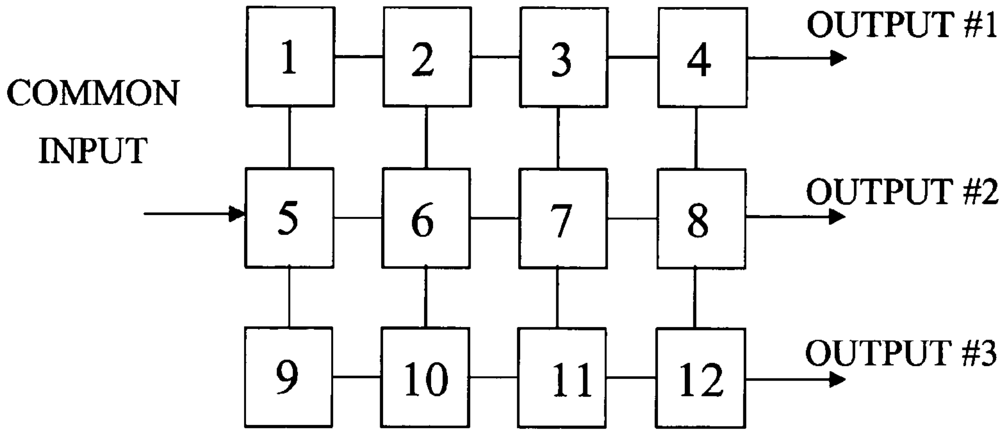
FIG. 6 shows the topology of a non limiting example of a particular triplexer according to the invention, designed to meet FIG. 5 specifications.
Figure 7:
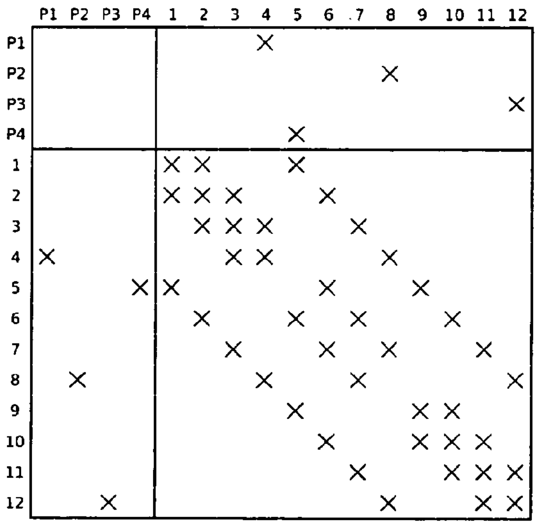
FIG. 7 shows which couplings are forced to be zero in the coupling matrix of the triplexer sketched in FIG. 6.

For the particular case where there are P rows, each having n series coupled resonators, in this case P=3 and n=4, such a device is sketched in FIG. 6. This embodiment has been designed based on the specifications included in FIG. 5, and its response has been simulated in order to verify expected performances. Its main performances are shown in figures from FIG. 11 to FIG. 15, in these plots the solid lines are different parameters of the device response and dashed ("straight") lines are specification masks. The respective channel response is the response measured between the common port and each channels' port, respectively corresponding to channels 1, 2 or 3.

As expected, the device presents three passbands, each of them corresponding to a different channel when measured between the common port and each channels outputs as shown on FIG. 12 and FIG. 13. On the other hand, FIG. 14 shows that there is good return loss performance for the whole triplexer band at the common port, this means electromagnetic signals in that band are allowed into the device without suffering heavy reflection losses. But only the corresponding channel signal is found with low attenuation at each channels' output port, the other channel's signals being attenuated as indicated by selectivity characteristic shown in FIG. 11. Thus the specified functionality of the triplexer is met.

Figure 19:
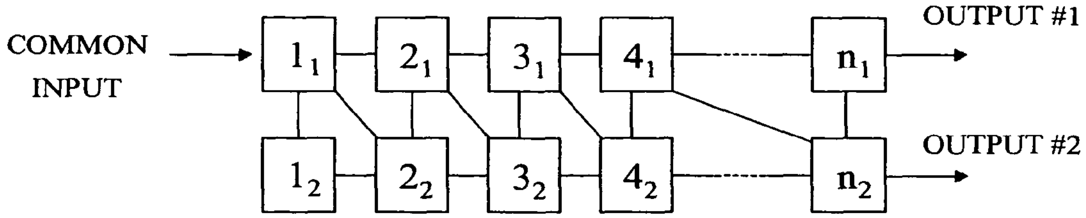

Other examples of some representative embodiments are disclosed hereafter:

FIG. 19 shows a first very simple exemplary embodiment of the invention, having two rows of n sequentially coupled resonators (where n is an integer number, chosen according to the specifications for the number of poles for each channel), numbered for the first row $\mathbf{1}_1$, $\mathbf{2}_1$, $\mathbf{3}_1$, . . . $n_1$ and for the second row $\mathbf{1}_2$, $\mathbf{2}_2$, $\mathbf{3}_2$, . . . $n_2$, the first resonator in each row being coupled to the second resonator in each row, which is in turn coupled to the third resonator and so on up until the n-th resonator. A common input terminal is connected in communication with a first resonator of one of the two filter rows (resonator $\mathbf{1}_1$ or $\mathbf{1}_2$), and two output terminals are coupled to respectively the n-th resonators of said first and second rows of resonators ($n_1$ and $n_2$).

Figure 18:
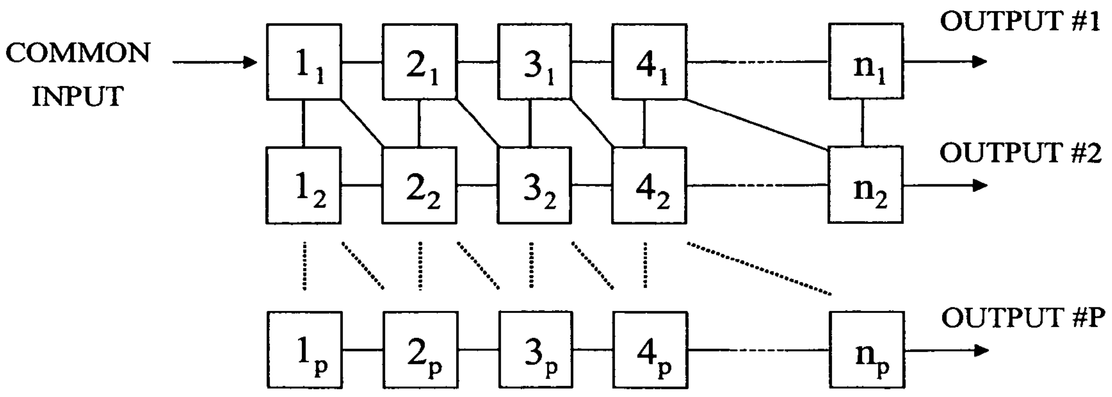

FIG. 18 shows a more general embodiment of the invention, namely a P-channel multiplexer, comprising:

- P rows of n series coupled resonators, (where P, n are integer numbers, and the number of channels is P≧2, and where n is chosen according to the specifications for the number of poles for each channel);
- A common terminal in communication with first resonator of any one of said P coupled resonators rows;
- P channel I/O terminals, each of them in communication with a respective last (n-th) resonator of each row, and
- at least one coupling which connects at least one resonator of the j-th row and a resonator of the (j+1)-th row, j belonging to j=1, . . . , P-1. (any coupling between any resonators of any rows).

Figure 17:
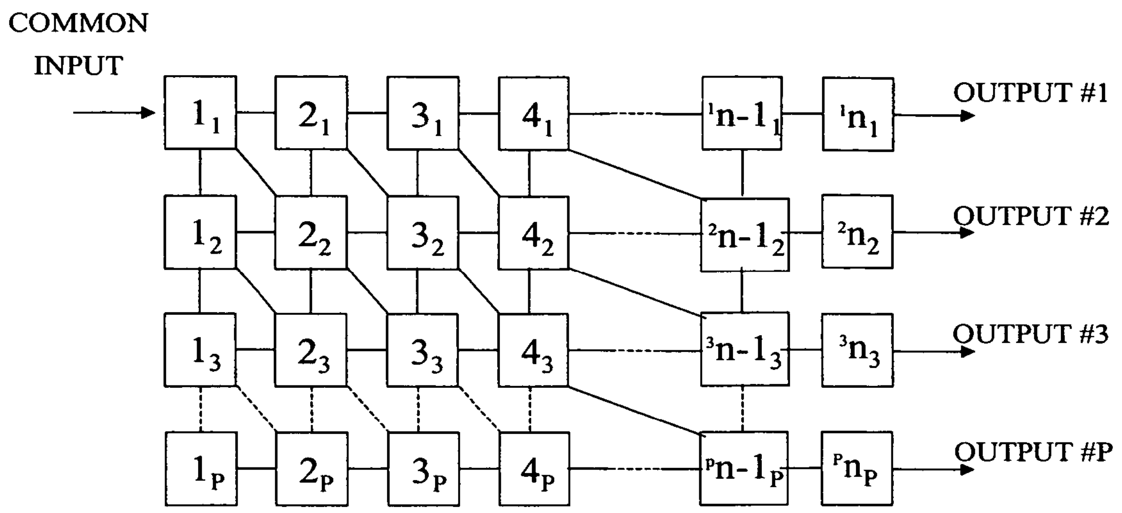
FIG. 17-FIG. 19 show other exemplary embodiments of the invention.

FIG. 17 shows an even more general embodiment of the invention, which is a P-channel multiplexer, comprising:

- P rows of $n_i$, coupled resonators, i belonging to i=1, . . . , P (where P is the number of channels, P≧2, and $n_i$ is an integer number of coupled resonators, chosen according to the specifications for the number of poles for each channel i),
- A common terminal in communication with first resonator of any of P coupled resonators rows;
- P channel terminals, each of them in communication with said last (n-th) resonator of each row,
- at least one coupling which connects at least one resonator of the j-th row and a resonator of the (j+1)-th row, j belonging to j=1 . . . P-1.

In this particular more general case, there is at least a pair of rows j-th, k-th rows, where j≠k and ${}^{j}n_j \neq {}^{k}n_k$.

For the very particular case where P=3 and and n=4 a device shown in FIG. 6 has been designed based on specifications included in FIG. 5, and its response has been simulated in order to verify expected performances, its main performances are shown in figures from 11 to 16, in these plots the solid lines are different parameters of the device response and dashed ("straight") lines are specification masks. The solid lines show each channel response, that is the response measured between the common port and each channels' port. Comparison between the specification and the simulated channel response shows the interest for the claimed invention performance.

The multiplexers previously described could be implemented using a variety of different resonators depending on the working frequency bands: lumped elements resonators, dielectric resonators, single cavity resonators, dual-mode cavity resonators or any other type known in the art.

The present invention has been described by way of example, and modifications and variations of the exemplary embodiments will suggest themselves to skilled artisans in this field, without departing from the spirit of the invention. The preferred embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A P-channel multiplexer, comprising P rows of sequentially coupled resonators, where P is an integer and P≧2, the i-th row of said P rows comprising $n_i$ of said sequentially coupled resonators different from the resonators of each other row of said P rows, where $n_i$ is an integer greater than or equal to 2, and i is an integer between 1 and P inclusive;

a common terminal in communication with first resonators of k of said rows of sequentially coupled resonators, where k is an integer less than P;

P channel terminals, each of them in communication with each respective last resonator of each respective row of said P rows, and at least one coupling which connects at least one resonator of any j-th row of said P rows and at least a resonator of the (j+1)-th row of said P rows, j belonging to j=1, . . . P-1.

2. The multiplexer described in claim 1, wherein the P rows all have the same number n of said sequentially coupled resonators, where P and n are integer numbers and P≧2.

3. The multiplexer described in claim 1, wherein k=1.

4. A P-channel multiplexer, comprising P rows of sequentially coupled resonators, where P is an integer and P≧2, the i-th row of said P rows comprising n, sequentially coupled resonators different from the resonators of each other row of said P rows, where $n_i$ is an integer greater than or equal to 2, and i is an integer between 1 and P inclusive;

a common terminal in communication with a first resonator of only a first of said rows of sequentially coupled resonators;

P channel terminals, each of them in communication with each respective last resonator of each respective row of said P rows, and at least one coupling which connects at least one resonator of any j-th row of said P rows and at least a resonator of the (j+1)-th row of said P rows, j belonging to j=1, . . . P-1.

* * * * *